United States Patent [19]

Takenaka

[11] Patent Number: 5,504,452

[45] Date of Patent: Apr. 2, 1996

[54] SEMICONDUCTOR INTEGRATED CIRCUIT OPERATING AT DROPPED EXTERNAL POWER VOLTAGE

[75] Inventor: Hiroyuki Takenaka, Yokohama, Japan

[73] Assignee: Kabushiki Kaisha Toshiba, Kawasaki, Japan

[21] Appl. No.: 212,736

[22] Filed: Mar. 14, 1994

[30] Foreign Application Priority Data

Mar. 12, 1993  [JP]  Japan ........................... 5-051710

[51] Int. Cl.[6] ............................................ G05F 1/10
[52] U.S. Cl. ..................... 327/541; 327/543; 327/546; 327/540
[58] Field of Search .................... 327/63, 77, 78, 327/538, 540, 541, 545, 546; 365/226, 232

[56] References Cited

U.S. PATENT DOCUMENTS

| | | | |
|---|---|---|---|
| 4,585,955 | 4/1986 | Uchida | 327/541 |
| 4,617,473 | 10/1986 | Bingham | 365/229 |
| 4,683,382 | 7/1987 | Sakurai et al. | 327/541 |
| 4,691,123 | 9/1987 | Hashimoto | 327/546 |
| 4,806,789 | 2/1989 | Sakihama et al. | 327/543 |
| 4,833,341 | 5/1989 | Watanabe et al. | 327/541 |
| 4,950,921 | 8/1990 | Takada | 327/541 |
| 5,046,052 | 9/1991 | Miyaji et al. | 365/228 |
| 5,184,031 | 2/1992 | Hayakawa et al. | 327/544 |
| 5,247,209 | 7/1993 | Cheng | 327/546 |
| 5,331,599 | 7/1994 | Yero | 365/228 |

*Primary Examiner*—Terry Cunningham
*Attorney, Agent, or Firm*—Banner & Allegretti, Ltd.

[57] ABSTRACT

A semiconductor integrated circuit used at a dropped external power voltage, comprises a voltage dropping circuit for receiving an external power voltage $V_{CC}$ and generating an internal power voltage $V_{DD}$, a voltage comparison circuit for detecting the level of the internal power voltage $V_{DD}$ and controlling the operation of the power voltage dropping circuit based on the detected result, a switch circuit operating when the level of the internal power voltage $V_{DD}$ decreases, to forcibly generate the internal power voltage $V_{DD}$ from the external power voltage $V_{CC}$, and a control circuit for activating the switch circuit.

28 Claims, 6 Drawing Sheets

SEMICONDUCTOR INTEGRATED CIRCUIT OPERATING AT DROPPED EXTERNAL POWER VOLTAGE

BACKGROUND OF THE INVENTION

1. Field of the Invention

The present invention relates to a semiconductor integrated circuit which generates an internal power voltage having a voltage level lower than the external power voltage, and uses the internal power voltage as a power voltage for the internal circuit.

2. Description of the Related Art

In the field of semiconductor memories such as the dynamic random access memory (DRAM) and the like, the miniaturization of semiconductor devices has recently progressed. As one part of the miniaturization process for the semiconductor devices, there is a technique for thinning the gate oxide film. However, as the thickness of the gate oxide film is reduced, the electrical field applied on the gate oxide film is naturally increased during the operation of the device, resulting in deterioration of the gate oxide film. The deterioration of the gate oxide film can be prevented without changing the voltage level of the external power voltage by reducing the electrical field applied to the gate oxide film during the operation. Therefore, there has been proposed a method of generating an internal power voltage which is lower than the external power voltage, by use of an on-chip voltage dropping circuit for dropping the external power voltage. With such a voltage dropping circuit, the internal circuit can be operated at a low internal power voltage even if an external power voltage having the same voltage level is to be applied to the semiconductor integrated circuit on which no voltage dropping circuit is provided. Therefore, the electrical field applied to the gate oxide film of an internal transistor can be reduced, thereby preventing the deterioration of the gate oxide film.

A known example of the semiconductor integrated circuit having a built-in voltage dropping circuit is disclosed in U.S. Pat. No. 4,585,955 (Yukimasa UCHIDA). This semiconductor integrated circuit includes a voltage dropping circuit for generating an internal power voltage having a low voltage level by dropping an external power voltage, a voltage comparison circuit and the like. The voltage dropping circuit consists of, for example, a P-channel MOS transistor, and serves to drop the external power voltage $V_{CC}$ supplied to a power terminal, and generate an internal power voltage $V_{DD}$ having a potential level lower than the $V_{CC}$. The voltage comparison circuit compares the internal power voltage $V_{DD}$ with the reference voltage to detect $V_{DD}$. The gate of the p-channel MOS transistor which constitutes the voltage dropping circuit is controlled by the detection output from the dropping circuit.

In the structure described above, when the voltage level of the internal power voltage $V_{DD}$ is decreased, an ON-stage resistance of the MOS transistor is reduced so as to compensate for the decrease in the voltage level. In contrast, when the voltage level of the $V_{DD}$ is increased, the MOS transistor is regulated so that the ON-stage resistance thereof is lowered to compensate for the increase in the voltage level. With the above-described operation, the internal power voltage $V_{DD}$ can be maintained at a constant voltage level.

The internal power voltage thus regulated to have a constant level is supplied as power voltage to the internal circuit, for example, made of a memory circuit and the like.

It is generally known that a semiconductor integrated circuit including a voltage dropping circuit has a narrow operation margin in the region where the level of the external power voltage is low. This is because a decrease in level of the internal power voltage within the low power voltage region has a great influence on the operation of the internal circuit, as compared to a decrease of voltage level which takes place in the region other than the low power voltage region.

Moreover, when the inner circuit is in the active state, that is, for example, when the internal circuit is of a DRAM type and the signal potential of a word line need to be boosted, or when the bit line is charged or discharged; a sudden and remarkable decrease in voltage level of the internal power voltage is exhibited. The decrease in level of the internal power voltage naturally reduces the operation margin of the internal circuit.

The main factor which causes the above-described drawbacks is that the detection output potential of the voltage comparison circuit cannot be set at the ground potential, which is completely 0V, though the detection output potential of the voltage comparison circuit can be lowered to a certain extent; therefore, the P-channel MOS transistor of the voltage dropping circuit is not rendered fully conductive, and the performance of the transistor cannot be demonstrated to a full extent. Such a decrease in voltage level of the internal power voltage cannot be followed sufficiently by the voltage dropping circuit, thereby interfering with the operation of the internal circuit.

SUMMARY OF THE INVENTION

The object of the present invention is to prevent a decrease in voltage level of the internal power voltage in a semiconductor integrated circuit which generates an internal power voltage having a voltage level lower than that of the external power voltage, by means of a voltage dropping circuit.

According to the present invention, there is provided a semiconductor integrated circuit comprising a terminal for receiving an external power voltage, internal power voltage generating means for generating an internal power voltage having a voltage level lower than that of the external power voltage, an internal node supplied with the internal power voltage, an internal circuit supplied with the internal power voltage supplied to the internal node as an operation voltage, first control means for detecting a voltage level of the internal power voltage in the internal node, and controlling, on the basis of the detected voltage level, an operation of the internal power voltage generating means such as to keep the voltage level of the internal power voltage constant, and second control means supplied with a control signal, for controlling a supply of the external power voltage supplied to the external terminal, to the internal node on the basis of the control signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the first embodiment of the present invention.

DETAILED DESCRIPTION OF THE PREFERRED EMBODIMENTS

Embodiment of the present invention will now be described in detail with reference to accompanying drawings. The components similar to each other throughout the figures will be designated by the same reference numerals, and the detailed descriptions thereof will not be repeated.

Figure 1:
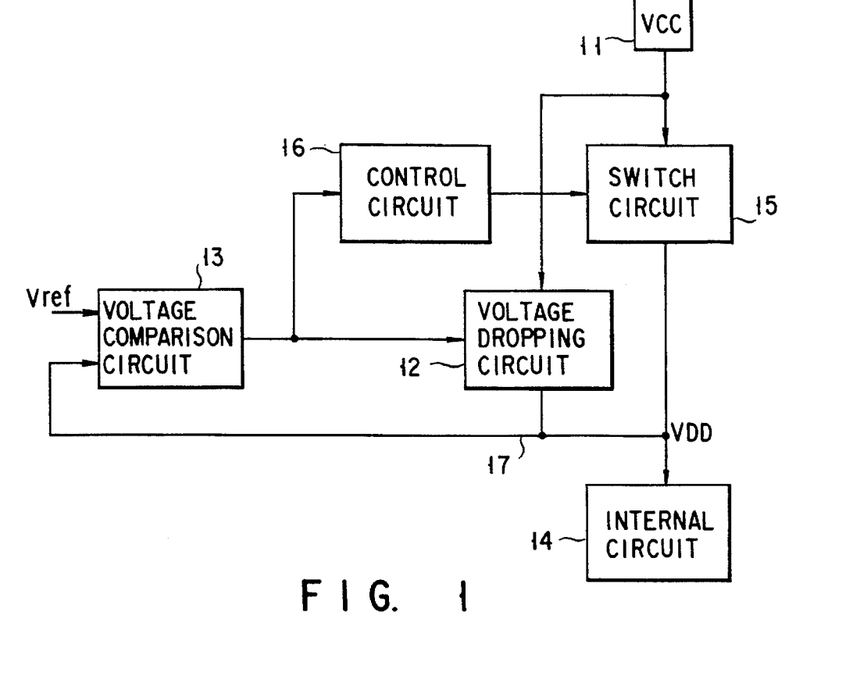

The semiconductor integrated circuit illustrated in FIG. 1, which is the first embodiment of the present invention, includes a power voltage terminal 11, a voltage dropping circuit 12, a voltage comparison circuit 13, an internal circuit 14, a switch circuit 15 and a control circuit 16.

The power voltage terminal 11 is supplied with an external power voltage $V_{CC}$, which is dropped by the power dropping circuit 12 to an internal power voltage $V_{DD}$ having a voltage level lower than $V_{CC}$, and supplied to an internal circuit node 17. The voltage comparison circuit 13 serves to compare the voltage level of the internal power voltage $V_{DD}$ with that of the reference voltage $V_{ref}$, and output a signal based on the comparison result. The output signal of the voltage comparison circuit 13 is supplied to the voltage dropping circuit 12, which controls the drop of the voltage in accordance with the output signal from the voltage comparison circuit 13. The switch circuit 15 is connected between the power voltage terminal 11 and the internal node 17. The switch circuit 15 operates only when the internal power voltage $V_{DD}$ in the internal node 17 significantly drops, and serves to supply the external power voltage $V_{CC}$ supplied to the power voltage terminal 11 to the internal node 17. The operation of the switch circuit 15 is controlled on the basis of the output from the control circuit 16, to which the output from the voltage comparison circuit 13 is supplied.

Although not shown in the figure, the internal circuit 14 includes DRAM memory cells, word lines, bit lines and the like, and is a DRAM circuit which increases the signal potential of word lines when set in the active state.

In the semiconductor integrated circuit having the above structure, when the internal power voltage $V_{DD}$ in the internal node 17 decreases to a predetermined level or lower, such a decrease in voltage is detected by comparing the internal power voltage with the potential level of the reference voltage $V_{ref}$ using the voltage comparison circuit 13. Based on the signal output from the voltage comparison circuit 13 upon detection, the voltage dropping circuit 12 carries out a voltage dropping operation to raise the internal power voltage $V_{DD}$ based on the signal output from the voltage comparison circuit 13. In contrast, when the internal power voltage $V_{DD}$ in the internal node 17 increases to a predetermined level or higher, such an increase in voltage is detected by comparing the internal power voltage with the potential level of the reference voltage $v_{ref}$ using the voltage comparison circuit 13. Based on the signal output from the voltage comparison circuit 13 upon detection, the voltage dropping circuit 12 carries out a voltage dropping operation to drop the internal power voltage $V_{DD}$ based on the signal output from the voltage comparison circuit 13. As described, the voltage dropping circuit 12 and the voltage comparison circuit 13 constitute a closed loop circuit, which serves to control the internal power voltage $V_{DD}$ at a constant value.

Should the case arise where a sudden drop of the internal power voltage $V_{DD}$ happens as the current consumed in the internal circuit 14 suddenly increases, the control circuit 16, upon reception of the output signal from the voltage comparison circuit 13, controls the switch circuit 15 to operate such that the external power voltage $V_{CC}$ supplied to the power voltage terminal 11 is output to the internal node 17. Thus, the sudden drop of the internal power voltage $V_{DD}$ is recovered.

Figure 2:
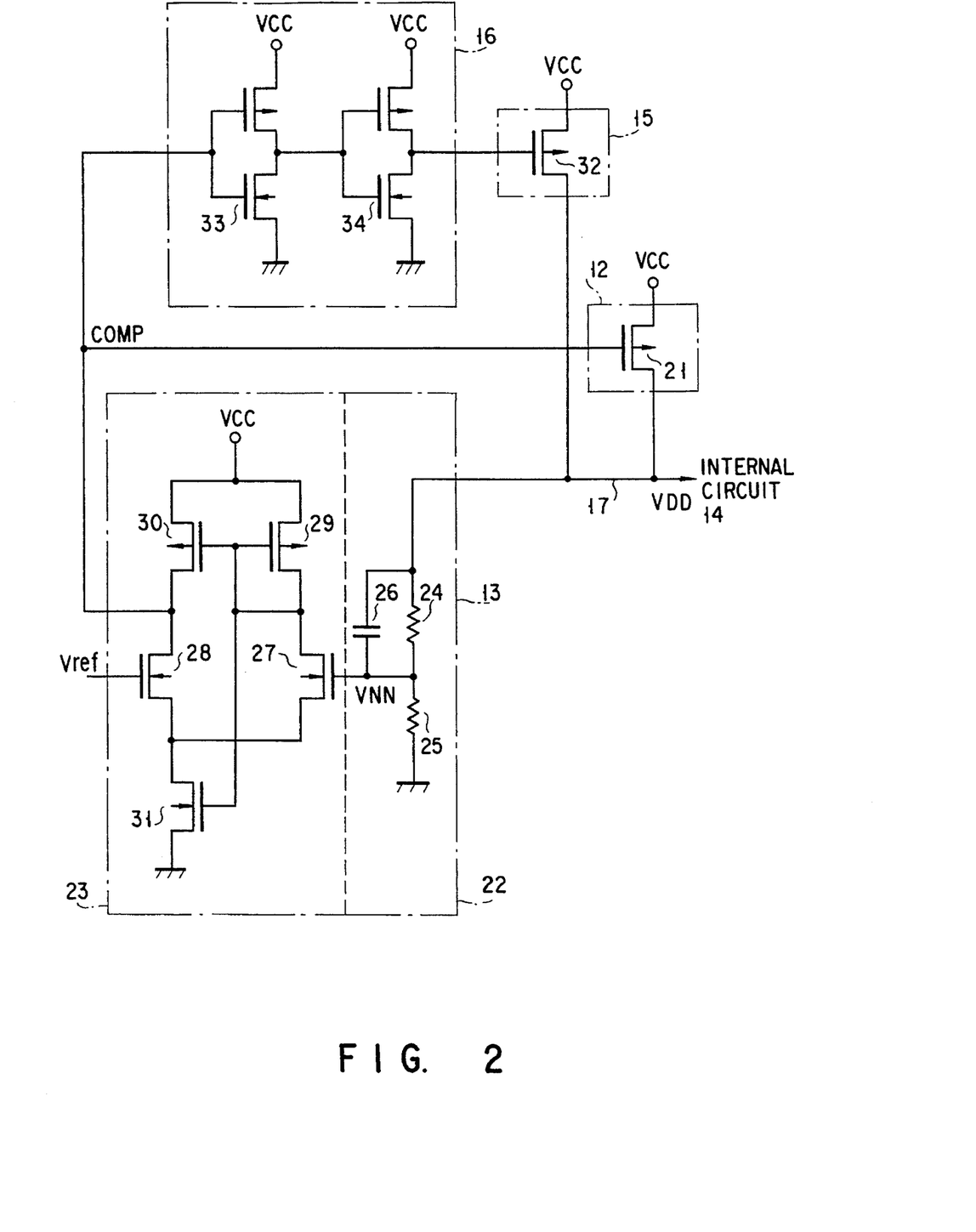
FIG. 2 is a circuit diagram showing a detailed circuit structure according to the first embodiment.

FIG. 2 shows details of every circuit but the internal circuit 14, of the circuit structure shown in FIG. 1.

The voltage dropping circuit 12 consists of a P-channel MOS transistor 21 having a source, which is connected to the node of the external power voltage $V_{CC}$; a drain which is connected to the internal node 17; and a gate.

The voltage comparison circuit 13 consists of a voltage division circuit 22 for dividing the internal power voltage $V_{DD}$, and a current-mirror-type comparison circuit 23 for comparing an output voltage $V_{NN}$ from the voltage division circuit 22 and the reference voltage $V_{ref}$. The voltage division circuit 22 consists of two resistors 24 and 25 connected in series between the internal node 17 and the ground voltage, and a capacitor 26 connected between both terminals of the resistors 24, for stabilizing the operation.

The current-mirror-type comparison circuit 23 consists of N-channel MOS transistors 27 and 28 to gates of which the voltage $V_{NN}$ and the reference voltage $V_{ref}$ are respectively supplied; two P-channel MOS transistors 29 and 30 acting as loads for both MOS transistors 27 and 28 and constituting a current mirror circuit; and an N-channel MOS transistor 31 connected between the above N-channel MOS transistors 27 and 28 and the ground potential, for current source. A detection output signal COMP obtained at the node where the MOS transistors 28 and 30 are connected in series, is supplied to the MOS transistor 21 in the voltage dropping circuit 12.

The switch circuit 15 consists of a P-channel MOS transistor 32 having a source, which is connected to the node of the external power voltage $V_{CC}$; a drain which is connected to the internal node 17; and a gate. The current supply capability, i.e. channel width, of the P-channel MOS transistor 32 is set smaller than that of the MOS transistor 21 in the voltage dropping circuit 12.

The control circuit 16 serves to amplify a detection output signal COMP of the voltage comparison circuit 13, and supply its amplified output to the gate of the MOS transistor 32 in the switch circuit 15. The control circuit 16 includes two CMOS inverters 33 and 34 each consisting of P-channel and N-channel MOS transistors. The two CMOS inverters 33 and 34 are connected in tandem. The circuit threshold of the front-stage CMOS inverter 33 to which the signal COMP is supplied, is set lower than that of the voltage dropping circuit 12 (absolute value of the threshold voltage of P-channel MOS transistor). The circuit threshold can be appropriately set by rendering the absolute value of the threshold voltage of the P-channel MOS transistor constituting the CMOS inverter 33, larger than the absolute value of the threshold voltage of the P-channel MOS transistor 21 constituting the voltage dropping circuit 12.

In the circuit shown in FIG. 2, when the value of the external power voltage $V_{CC}$ is in a relatively high region, the value of the internal power voltage $V_{DD}$ decreases from a predetermined value. If the output voltage $V_{NN}$ of the voltage division circuit 22 in the voltage comparison control 13 decreases to a level lower than the reference voltage $V_{ref}$, an ON-stage resistance of the MOS transistor 28 decreases to a level lower than that of the MOS transistor 27 in the current-mirror-type comparison circuit 23, and the potential of the output signal COMP decreases to a level lower than the previous state. Consequently, an ON-stage resistance of the MOS transistor 21 in the voltage dropping circuit 12 decreases, and the value of the internal power voltage $V_{DD}$ rises.

In contrast, when the value of the internal power voltage $V_{DD}$ increases to a level higher than the predetermined value, and the output voltage $V_{NN}$ increases to a level higher than the reference voltage $V_{ref}$, the ON-stage resistance of the MOS transistor 28 increases to a level higher than that of the MOS transistor 27 in the current-mirror-type comparison circuit 23, and the potential of the output signal COMP increases to a level higher than the previous state. Consequently, the value of the internal power voltage $V_{DD}$ decreases. As the above-described operation is carried out, the internal power voltage $V_{DD}$ is controlled to be set at a constant level.

The operation in the low power voltage region, where the MOS transistor 21 in the voltage dropping circuit 12 is not rendered sufficiently conductive, will be described.

When the circuit operates at a high power voltage as described above, no problem rises. If the circuit operates at a voltage within the low power voltage region, where the external power voltage $V_{DD}$ is low, the output signal COMP of the voltage comparison circuit 13 cannot be decreased to the ground level, i.e. completely 0V, though it is decreased to a low level. Thus, the MOS transistor 21 in the voltage dropping circuit 12 cannot be rendered fully conductive. As a result, the internal power voltage $V_{DD}$ cannot be controlled to a constant level.

In the circuit shown in FIG. 2, the output power $V_{NN}$ of the voltage division circuit 22 in the voltage comparison circuit 13 decreases to a level lower than the reference voltage $V_{ref}$, and the potential of the output signal COMP of the current-mirror-type comparison circuit 23 decreases. When the potential of the signal COMP decreases to a level lower than the circuit threshold voltage of the front-stage CMOS inverter 33 in the control circuit 16, the output signal from the CMOS inverter 33 increases to a high level. Further, the output signal from the rear-stage CMOS inverter 34 decreases to a sufficiently low level, i.e. ground level, rendering the MOS transistor 32 in the switch circuit 15 fully conductive. Specifically, by the amplification of the two MOS inverters 33 and 34 in the control circuit 16, the output signal of the control circuit 16 is made to have a voltage value sufficiently close to a ground voltage of 0V. Consequently, the MOS transistor 32 in the switch circuit 15 can exhibit its current supply capability to a full extent. The value of the internal power voltage $V_{DD}$ in the internal node 17 is forcibly set by the external power voltage $V_{CC}$ via the MOS transistor 32, so that the $V_{DD}$ approaches to the ideal value.

Figure 3:
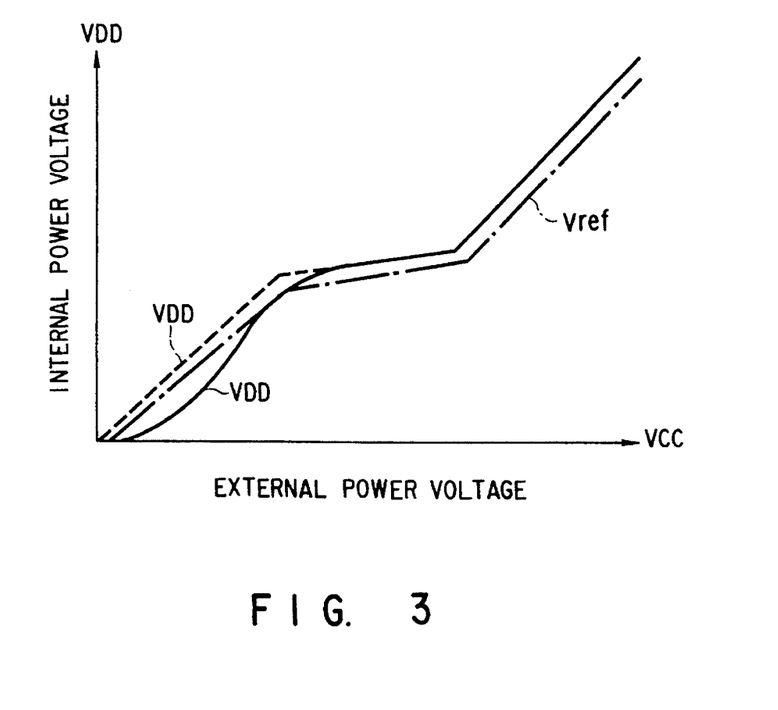
FIG. 3 is a graph illustrating characteristics of the circuit according to the first embodiment.

FIG. 3 shows an example of the characteristics of the reference voltage $V_{ref}$ supplied to the external power voltage $V_{CC}$, the internal power voltage $V_{DD}$ and the voltage comparison circuit 13. In this figure, the solid line represents the characteristic curve of the internal power voltage $V_{DD}$ of the conventional technique, the broken line represents the characteristic curve of the ideal internal power voltage $V_{DD}$, and the single dot chain line represents the characteristic curve of the reference voltage $V_{ref}$. With the conventional technique, the characteristic curve of the real internal power voltage $V_{DD}$ is greatly displaced from the ideal one in the low power voltage region. Such a displacement is caused by the insufficient conduction of the MOS transistor 32 in the switch circuit 15. However, in this embodiment, a decrease in level of the internal power voltage $V_{DD}$ in the low power voltage region can be compensated with by means of the control circuit 15 and the switch circuit 16, so that the characteristic curve of the $V_{DD}$ approaches the ideal one represented by broken line shown in FIG. 3.

In the case where the internal circuit 14 is set in the active state, the current consumed is suddenly increased, and the internal power voltage $V_{DD}$ is suddenly decreased; the output voltage $V_{NN}$ of the voltage division circuit in the voltage comparison circuit 13 is accordingly decreased. Consequently, the ON-stage resistance of the MOS transistor 28 is decreased more than that of the MOS transistor 27 in the current-mirror-type comparison circuit 23, thereby lowering the potential of the signal COMP. When the potential of the signal COMP is decreased to a level lower than the circuit threshold voltage of the front-stage CMOS inverter 33 in the control circuit 16, the output signal of the CMOS inverter 33 is raised to a high level, and the output signal of the rear-stage CMOS inverter 34 is decreased to a sufficiently low level, that is a level sufficiently close to a ground voltage of 0V. Therefore, the MOS transistor 32 in the switch circuit 15 can be made fully conductive. In other words, if the internal power voltage $V_{DD}$ is suddenly dropped, the MOS transistor 32 in the switch circuit 15 can be made fully conductive, and therefore the value of the internal power voltage $V_{DD}$ in the internal circuit node can be forcibly set by the external power voltage $V_{CC}$.

Figure 4A:
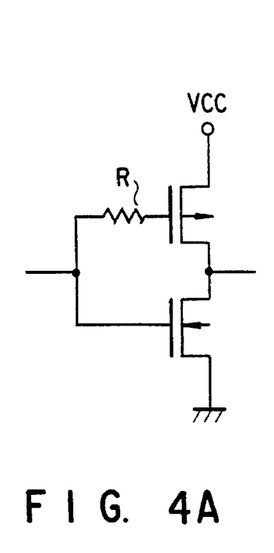
FIG. 4A is a circuit diagram showing another example of a part of the circuit structure according to the first embodiment.
Figure 4B:
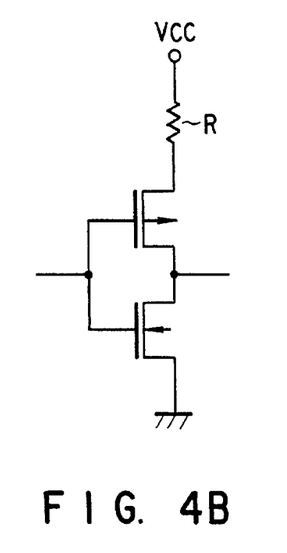
FIG. 4B is a circuit diagram showing still another example of a part of the circuit structure according to the first embodiment.
Figure 4C:
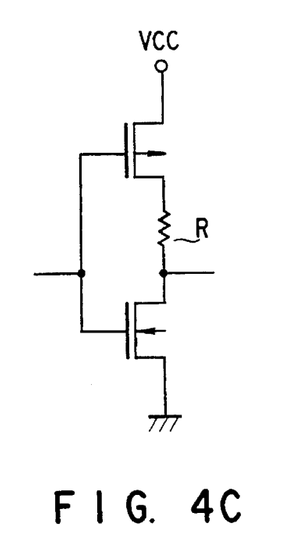
FIG. 4C is a circuit diagram showing still another example of a part of the circuit structure according to the first embodiment.

Each of FIGS. 4A, 4B and 4C shows a specific example for adjusting the circuit threshold of the first-stage CMOS inverter 33 in the control circuit 16. In the CMOS inverter 33 shown in FIG. 2, the threshold voltages of the P-channel and N-channel MOS transistors are adjusted so as to decrease the circuit threshold of the CMOS inverter 33 to a level lower than that of the voltage dropping circuit 12. In the inverter 33 shown in FIG. 4A, the threshold voltage thereof is adjusted by inserting a resistor R in series with the gate of the P-channel MOS transistor. In the inverter 33 shown in FIG. 4B, the threshold voltage thereof is adjusted by inserting a resistor R in series with the source of the P-channel MOS transistor. In the inverter 33 shown in FIG. 4C, the threshold voltage thereof is adjusted by inserting a resistor R in series with the drain of the P-channel MOS transistor.

Figure 5:
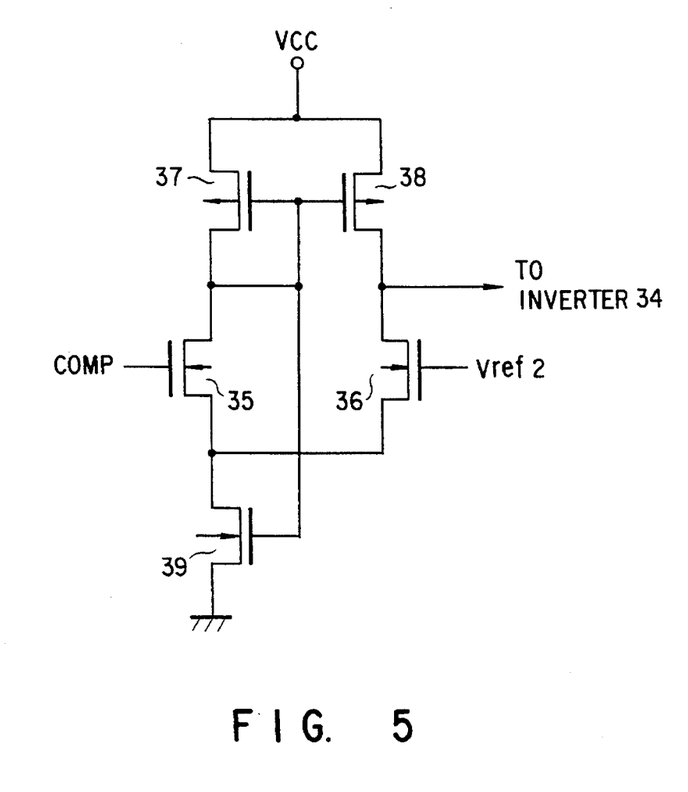
FIG. 5 is a circuit diagram showing still another example of a part of the circuit structure according to the first embodiment.

FIG. 5 shows the structure of a comparison circuit which can be used in place of the first-stage CMOS inverter 33 in the control circuit 16 shown in FIG. 2. The comparison circuit consists of N-channel MOS transistors 35 and 36 to gates of which the detection output signal COMP and a reference voltage $V_{ref2}$ different from the reference voltage $V_{ref}$ are respectively supplied; two P-channel MOS transistors 37 and 38 serving as current mirror loads on both MOS transistors 35 and 36 and constituting a current mirror circuit; and a N-channel MOS transistor 39 for current source, inserted between both N-channel MOS transistors 35 and 36, and the ground voltage.

In the comparison circuit having the above-described structure, the detection signal COMP is compared pared with the reference voltage $v_{ref2}$, and when the potential of the signal COMP<$V_{refs}$, the output is raised to a high level, and the output of the CMOS inverter 34 is decreased to a low level. Thus, the P-channel MOS transistor 32 in the switch circuit 15 is rendered conductive. Therefore, the potential of the signal COMP for operating the switch circuit 15 can be determined in accordance with the reference voltage $V_{ref2}$ by use of the comparison circuit shown in FIG. 5 in place of the CMOS inverter 33.

Figure 6:
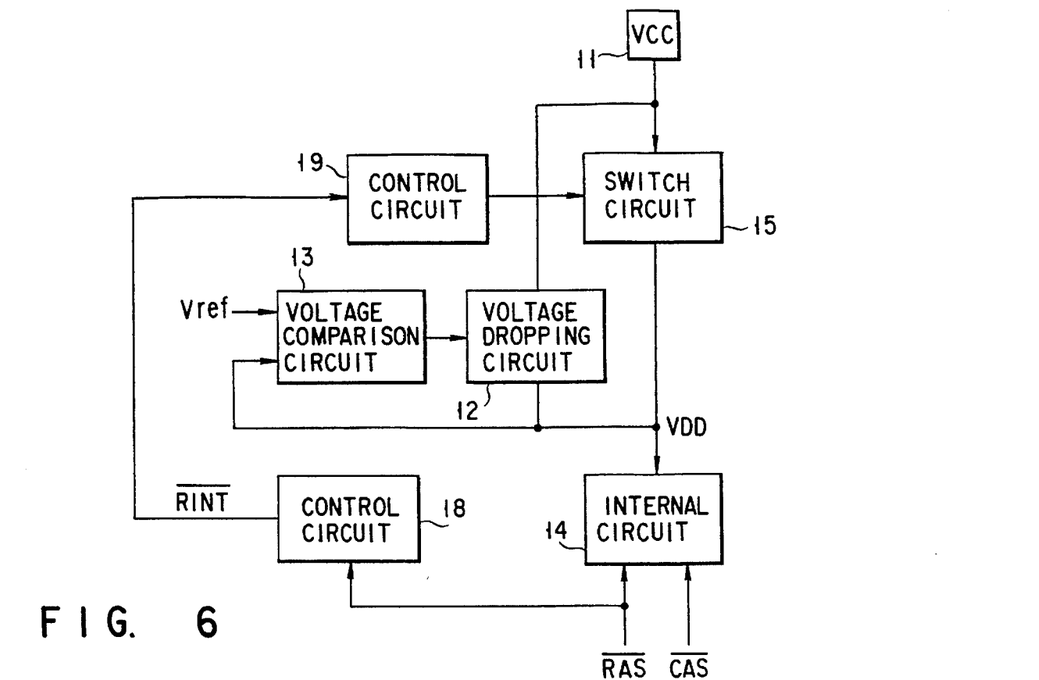
FIG. 6 is a block diagram showing the second embodiment according to the present invention.

FIG. 6 is a block diagram showing a semiconductor integrated circuit according to the second embodiment of the present invention. The circuit of the second embodiment is different from that of the first embodiment in that there are provided in the second embodiment, control circuits 18 and 19 different from the control circuit 16, to which the detection output signal COMP of the voltage comparison circuit 13 is supplied.

The address input control in the internal circuit 14 (DRAM circuit) is carried out by using a row-address-strobe signal (/RAS) and a column-address-strobe signal (/CAS). The control circuit 18 is supplied with the row-address-strobe signal/RAS which is supplied to the internal circuit 14. A internal signal/RINT which is synchronized with the signal/RAS, is output from the control circuit 18. The internal signal/RINT is supplied to the control circuit 19, and the operation of the switch circuit 15 is controlled by the output of the control circuit 19.

Figure 7:
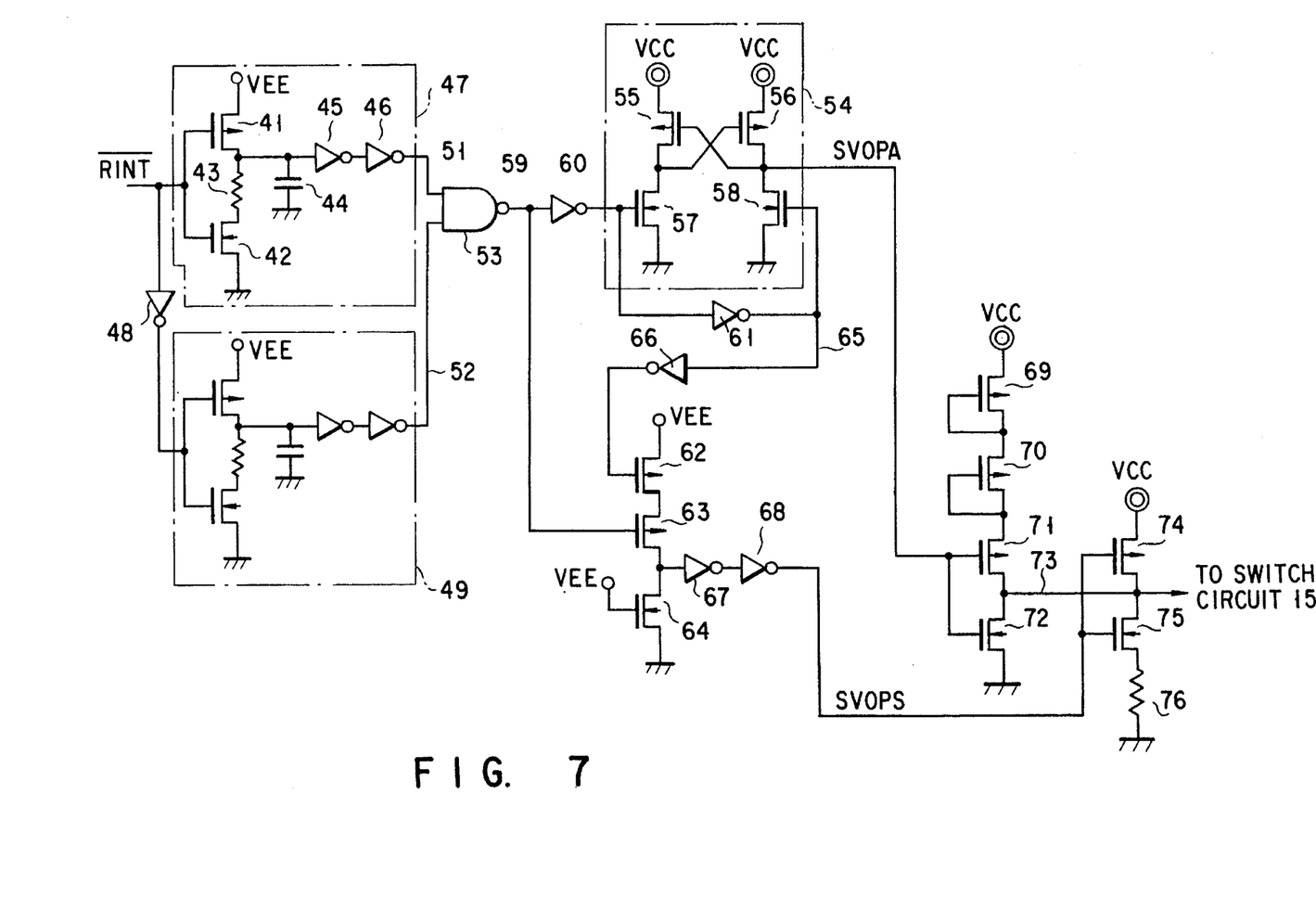
FIG. 7 is a circuit diagram showing details of a part of the circuit structure according to the second embodiment.

FIG. 7 shows a detailed structure of the control circuit 19 in the circuit of the embodiment shown in FIG. 6. The internal signal/RINT, which is generated by the control circuit 18 and synchronized with the signal/RAS, is supplied to a signal delay circuit 47 consisting of a P-channel MOS transistor 41, N-channel MOS transistor 42, resistor 43, capacitor 44, and two inverters 45 and 46. The internal signal/RINT is supplied via an inverter 48 to a signal delay circuit 49, which has a similar structure to that of the signal delay circuit 47. The signal delay circuits 47 and 49 each serve to delay an input signal by a predetermined time, and output the delayed signal from output nodes 51 and 52, respectively, to an NAND gate 53.

The flip-flop circuit 54 consists of two P-channel MOS transistors 55 and 56 and two N-channel MOS transistors 57 and 58. The P-channel MOS transistors 55 and 56 function as load MOS transistors, whereas the N-channel MOS transistors 57 and 58 function as drive MOS transistors. An output from an output node 59 of the NAND gate 53 is supplied via an inverter 60, to the gate of the drive N-channel MOS transistor 57, and an output signal from the inverter 60 is supplied via an inverter 61 to the gate of the drive N-channel MOS transistor 58.

Two P-channel MOS transistors 62 and 63, and an N-channel MOS transistor 64 are connected in series between an internal power voltage $V_{EE}$ having a predetermined value different from the internal power voltage $V_{DD}$, and the ground voltage. A signal from an output node 65 of the inverter 61 is supplied via an inverter 66 to the gate of the P-channel MOS transistor 62. A signal output from the NAND circuit 53 is supplied to the gate of the P-channel MOS transistor 63. The voltage $V_{EE}$ is supplied to the gate of the N-channel MOS transistor 64. A signal obtained at the node to which the drains of the P-channel MOS transistor 63 and the N-channel MOS transistor 64 are commonly connected, is supplied to the front-stage inverter 67 which supplies the signal to the rear-stage inverter and 68 connected in series therewith. A signal SVOPS is output from the rear-stage inverter 68.

Three P-channel MOS transistors 69, 70 and 71 and an N-channel MOS transistor 72 are connected in series between the external power voltage $V_{CC}$ and the ground voltage. The gate of the P-channel MOS transistor 69 is connected to the drain thereof, and the gate of the transistor 70 is connected to the drain thereof. An output signal SVOPA of the flip-flop circuit 54 is supplied to the gate of the P-channel MOS transistor 71 and the gate of the N-channel MOS transistor 72. A P-channel MOS transistor 74 is connected between the node 73 to which the drains of the P-channel MOS transistor 71 and the N-channel MOS transistor 72 are commonly connected, and the $V_{CC}$. Further, an N-channel MOS transistor 75 and resistor 76 are connected in series between the node 73 and the ground voltage. The gate of the P-channel MOS transistor 74 and the gate of the N-channel MOS transistor 75 are commonly connected to a node, to which the signal SVOPS is supplied. Then, a signal from the node 73 is supplied to the switch circuit 15.

Figure 8:
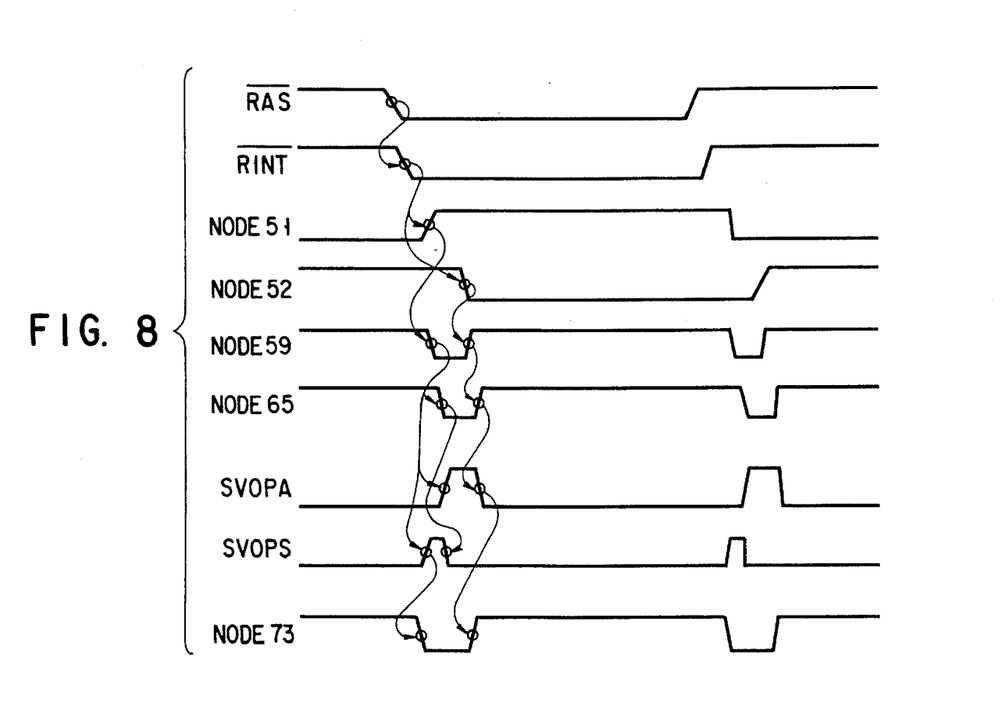
FIG. 8 is a timing chart illustrating an example of the operation of the circuit structure according to the second embodiment.

The control circuit 19 having the structure shown in FIG. 7, in which the internal signal/RINT changes from a high level to a low level or vice versa, serves to generate a control signal to the node 73 such that the internal signal is rendered to have an "L" level for a predetermined period of time when the internal circuit 14 is set in the active state. An example of the operation is illustrated in the form of timing chart shown in FIG. 8. When the row-address-strobe signal/RAS varies as shown in this figure, the internal signal/RINT varies synchronously with the signal/RAS. Thus, at the level change of the signal/RINT, the signal of the node 73 is set at the "L" level only for a predetermined time. While the signal from the node 73, i.e. the output signal from the control circuit 19, is at the "L" level, the P-channel MOS transistor 32 in the switch circuit 15 is rendered conductive, thereby compensating with a remarkable decrease in the internal power voltage $V_{DD}$.

In the circuit structure shown in FIG. 6, the control circuit 19 is not controlled by an output signal from the voltage comparison circuit 13, and therefore a decrease in the internal power voltage $V_{DD}$ in the low-power voltage region cannot be compensated for, unlike the circuit structure shown in FIG. 1. In order to meet the decrease in the internal power voltage $V_{DD}$ in the low-voltage power region, there should only be provided a control circuit similar to that of the circuit structure shown in FIG. 1 so as to control the switch circuit 15 by means of a logic OR signal of output signals from the control circuits 19 and 16.

The control circuit 19 in the circuit structure shown in FIG. 6 is not limited to the type having the structure shown in FIG. 7. For example, as explained, the control circuit 19 shown in FIG. 7 is the type in which an output signal is set at a low level only for a predetermined time when the level of the signal/RINT changes; but it may be the type in which output signals are respectively set at a low level only for a predetermined time when levels of a plurality of signals change. Specifically, the circuit structure shown in FIG. 9 meets the case where signals SVOPA and SVOPS shown in FIG. 7 are obtained based on a plurality of input signals IN1, IN2 and IN3. In this structure, the input signal IN1 is a RAS signal, and corresponds to, for example, /RINT or /RAS, the input signal IN2 is a CAS signal, and corresponds to, for example, a signal for driving the sense amplifier, and the input signal IN3 is a data output control signal, and corresponds to, for example, a signal for driving the DQ buffer. In this circuit structure, the following new circuits are added to the structure shown in FIG. 7, i.e. a circuit 81 for detecting a change in level of the input signal IN2, a circuit 82 for detecting a change in level of the input signal IN3, an NAND gate 83 supplied with output signals from both circuits 81 and 82, an NAND gate 84 supplied with output signals from the NAND gate 53 and the NAND gate 83, and an inverter 85 for reversing an output signal from the NAND gate 84. Further, the items similar to those shown in FIG. 7 are designated by the same reference numerals, and the explanation therefore are omitted.

Figure 9:
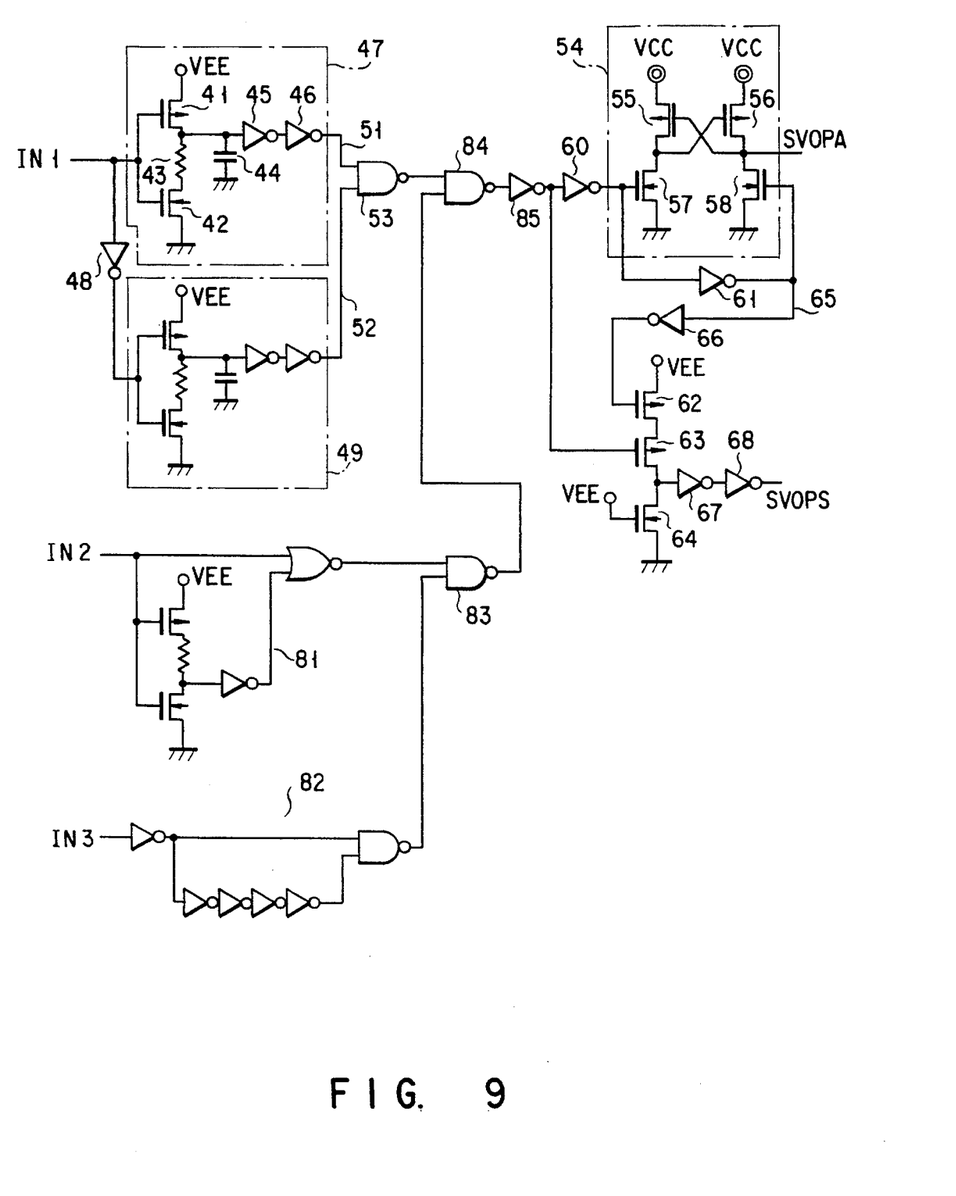
FIG. 9 is a circuit diagram showing details of a part of the circuit structure according to the third embodiment of the present invention.

With use of the control circuit having the above-described structure, the switch circuit 15 can be operated not only when the level of the input signal IN1 corresponding to the signal/RINT changes, but also when the levels of the input signals IN2 and IN3 change. Therefore, a decrease in the internal power voltage $V_{DD}$ can be compensated for when a great amount of current is required in the internal circuit 14.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A semiconductor integrated circuit used at a dropped external power voltage, comprising:

a terminal for receiving an external power voltage;

an internal node;

internal power voltage generating means for generating an internal power voltage having a voltage level lower than that of the external power voltage supplied to said terminal and supplying the internal power voltage to said internal node;

an internal circuit supplied with the internal power voltage supplied to said internal node as an operation voltage;

first control means for detecting a voltage level of the internal power voltage at said internal node, and generating a control signal for controlling, on the basis of the detected voltage level, an operation of said internal power voltage generating means so as to keep the voltage level of the internal power voltage constant; and second control means supplied with the control signal, for controlling a supply of the external power voltage supplied to said terminal to said internal node on the basis of the control signal.

2. The semiconductor integrated circuit according to claim 1, wherein said first control means includes voltage comparison means for comparing the internal power voltage at said internal node with a reference voltage to provide the control signal.

3. The semiconductor integrated circuit according to claim 2, wherein said internal power voltage generation means includes voltage dropping means for controlling dropping of the external power voltage on the basis of the control signal.

4. The semiconductor integrated circuit according to claim 3, wherein said voltage dropping means includes a P-channel MOS transistor having a source, a drain and a gate, a source-drain path inserted between said terminal and said internal node, and said gate supplied with the control signal.

5. The semiconductor integrated circuit according to claim 1, wherein said second control means compares the control signal with a threshold voltage and operates such that the external power voltage is supplied to said internal node when a voltage level of the control signal is lower than the threshold voltage.

6. The semiconductor integrated circuit according to claim 1, wherein said internal power voltage generation means has a predetermined circuit threshold voltage; and said second control means includes signal amplification means having a circuit threshold voltage lower than that of said internal power voltage generation means, and switch means for supplying the external power voltage to said internal node based on an output of said signal amplification means.

7. The semiconductor integrated circuit according to claim 6, wherein said signal amplification means includes a first signal inverting circuit having a circuit threshold voltage lower than that of said internal power voltage generation means, and a second signal inverting circuit for receiving an output from said first signal inverting circuit.

8. The semiconductor integrated circuit according to claim 6, wherein said switch means includes a P-channel MOS transistor having a source, a drain and a gate, a source-drain path inserted between said terminal and said internal node, and said gate supplied with an output from said voltage amplification means.

9. The semiconductor integrated circuit according to claim 6 wherein said signal amplification means includes a pair of CMOS inverters connected in tandem.

10. The semiconductor integrated circuit according to claim 1, wherein said internal circuit includes a dynamic memory cell array, and is a dynamic memory circuit controlled based on at least a row-address-strobe signal and a column-address-strobe signal.

11. A semiconductor integrated circuit used at a dropped external power voltage, comprising:

a terminal for receiving an external power voltage;

an internal node;

internal power voltage generating means for generating an internal power voltage having a voltage level lower than that of the external power voltage supplied to said terminal and supplying the internal power voltage to said internal node;

an internal circuit supplied with the internal power voltage supplied to said internal node as an operation voltage;

first control means for detecting a voltage level of the internal power voltage at said internal node, and controlling, on the basis of the detected voltage level, an operation of said internal power voltage generating means so as to keep the voltage level of the internal power voltage constant; and second control means supplied with an output from said first control means, for controlling a supply of the external power voltage supplied to said terminal to said internal node on the basis of the output from said first control means.

12. The semiconductor integrated circuit according to claim 11, wherein said second control means operates such that the external power voltage is supplied to said internal node based on the output of said first control means when a voltage level of the internal power voltage supplied to said internal node decreases to a predetermined voltage level or lower.

13. The semiconductor integrated circuit according to claim 11, wherein said internal power voltage generation means has a predetermined circuit threshold voltage; and said second control means includes signal amplification means having a circuit threshold voltage lower than that of said internal power voltage generation means, and switch means for supplying the external power voltage to said internal node based on an output of said signal amplification means.

14. A semiconductor integrated circuit used at a dropped external power voltage, comprising:

a terminal for receiving an external power voltage;

an internal node;

internal power voltage generating means for generating an internal power voltage having a voltage level lower than that of the external power voltage supplied to said terminal and supplying the internal power voltage to said internal node;

an internal circuit supplied the with internal power voltage supplied to said internal node as an operation voltage, said internal circuit including a dynamic memory cell array which is controlled based on at least a row-address-strobe signal and a column-address-strobe signal;

first control means for detecting a voltage level of the internal power voltage at said internal node, and controlling, on the basis of the detected voltage level, an operation of said internal power voltage generating means so as to keep the voltage level of the internal power voltage constant;

control signal generation means, responsive to at least one of the row-address-strobe signal and the column-address-strobe signal, for generating a control signal; and second control means operating in response to the control signal generated when at least one of the row-address-strobe signal and the column-address-strobe signal is set in an active state, and supplying the external power voltage supplied to said terminal to said internal node based on the control signal.

15. The semiconductor integrated circuit according to claim 14, wherein said first control means includes voltage comparison means for comparing the internal power voltage at said internal node with a reference voltage.

16. The semiconductor integrated circuit according to claim 14, wherein said control signal generation means is designed to receive the row-address-strobe signal, and generates the control signal each time the level of the row-address-strobe signal changes state.

17. The semiconductor integrated circuit according to claim 14, wherein said control signal generation means is designed to receive the row-address-strobe signal and the column-address-strobe signal, and generates the control signal each time the levels of the row-address-strobe signal and the column-address-strobe signal change state.

18. An internal power supply circuit comprising:

a first node supplied with an external power supply potential;

a second node supplied with a ground potential;

a third node at which an internal power supply potential is supplied;

a voltage division circuit connected between said third node and said second node, for generating a first signal at an output node thereof;

a first voltage comparison circuit connected to the output node of said voltage division circuit, for comparing a potential level of the first signal and a first reference potential level, and for generating, at an output node thereof, a second signal which represents a result of the comparing of the potential level of the first signal and the first reference potential level;

a buffer circuit connected to the output node of said first voltage comparison circuit and generating a third signal at an output node thereof;

a first transistor connected between said first and third nodes, having a gate which is supplied with the second signal from said first voltage comparison circuit; and a second transistor connected between said first and third nodes, having a gate which is supplied with the third signal from said buffer circuit.

19. A circuit according to claim 18, wherein said buffer circuit includes:

P-channel and N-channel MOS transistors each having a gate and a source-drain path, the source drain paths of said P-channel and N-channel MOS transistors being connected in series between said first node and said second node;

a wire connected between said voltage comparison circuit and the gate of said N-channel MOS transistor;

a resistor connected between said voltage comparison circuit and the gate of said P-channel MOS transistor; and a CMOS inverter having an input connected to a series connection point of the source-drain path of said P-channel and N-channel MOS transistors.

20. A circuit according to the claim 18, wherein said buffer circuit includes:

a resistor having a first end and a second end, the first end being connected to said first node;

P-channel and N-channel MOS transistors each having a gate and a source-drain path, the source drain paths of said P-channel and N-channel MOS transistors being connected in series between the second end of said resistor and said second node;

a wire connected between said voltage comparison circuit and the gates of said P-channel and N-channel MOS transistors; and a CMOS inverter having an input connected to a signal of a series connection point of the source-drain path of said P-channel and N-channel MOS transistors.

21. A circuit according to claim 18, wherein said buffer circuit includes:

a P-channel MOS transistor having a gate and a source-drain path, a first end of which is connected to said first node;

a resistor having a first end and a second end, the first end being connected to a second end of the source-drain path of said P-channel MOS transistor;

an N-channel MOS transistor having a gate and a source-drain path which is connected between the second end of said resistor and said second node;

a wire connected between said voltage comparison circuit and the gates of both P-channel and N-channel MOS transistors; and a CMOS inverter having an input connected to a series connection point of the source-drain path of said P-channel and N-channel MOS transistors.

22. A circuit according to claim 18, wherein said buffer circuit includes:

a second voltage comparison circuit for comparing a potential level of the second signal from said first voltage comparison circuit and a second reference potential level, and for supplying a fourth signal to an output node; and a CMOS inverter having an input connected to the output node of said second voltage comparison circuit.

23. A circuit according to claim 18, wherein each of said first and second transistors is a P-channel MOS transistor.

24. A circuit according to claim 18, further comprising:

an internal circuit supplied with the internal power voltage supplied to said third node as an operation voltage, said internal circuit including a dynamic memory array which is controlled based on at least a row-address-strobe signal and a column-address-strobe signal.

25. An internal power supply circuit comprising:

a first node supplied with an external power supply potential;

a second node supplied with a ground potential;

a third node at which an internal power supply potential is supplied;

a voltage division circuit connected between said third node and said second node, for generating a first signal at an output node thereof;

a voltage comparison circuit connected to the output node of said voltage division circuit, for comparing a potential level of the first signal and a reference potential level, and for generating, at an output node thereof, a second signal which represents a result of the comparing of the potential level of the first signal and the reference potential level;

a control circuit for generating a pulse signal having a predetermined width, in response to an externally supplied fourth signal;

a first transistor having a gate which is supplied with the second signal from said voltage comparison circuit, and connected between said first and third nodes; and a second transistor having a gate which is supplied with the pulse signal from said control circuit, and connected between said first and third nodes.

26. A circuit according to claim 25, wherein each of said first and second transistors is a P-channel MOS transistor.

27. A circuit according to claim 25, further comprising:

an internal circuit supplied with the internal power voltage supplied to said third node as an operation voltage, said internal circuit including a dynamic memory array which is controlled based on at least a row-address-strobe signal and a column-address-strobe signal.

28. A circuit according to claim 25, wherein the fourth signal is a row-address-strobe signal.

* * * * *